(12) United States Patent  
Hohlfeld et al.

(10) Patent No.: US 8,981,545 B2  
(45) Date of Patent: Mar. 17, 2015

(54) EXPLOSION-PROTECTED SEMICONDUCTOR MODULE

(71) Applicant: Infineon Technologies AG, Neubiberg (DE)

(72) Inventors: Olaf Hohlfeld, Warstein (DE); Guido Boenig, Heidelberg (DE); Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 67 days.

(21) Appl. No.: 13/932,531

(22) Filed: Jul. 1, 2013

(65) Prior Publication Data

US 2014/0035117 A1     Feb. 6, 2014

(30) Foreign Application Priority Data

Jul. 2, 2012  (DE) .................... 10 2012 211 446

(51) Int. Cl.
| | |
|---|---|
| *H01L 23/16* | (2006.01) |
| *H01L 23/24* | (2006.01) |
| *H01L 23/00* | (2006.01) |
| *H01L 25/18* | (2006.01) |
| *H01L 23/29* | (2006.01) |

(52) U.S. Cl.  
CPC ............... *H01L 23/24* (2013.01); *H01L 24/49* (2013.01); *H01L 25/18* (2013.01); *H01L 23/291* (2013.01); *H01L 24/48* (2013.01); *H01L 24/42* (2013.01); *H01L 2224/48091* (2013.01); *H01L 2224/48137* (2013.01); *H01L 2224/48472* (2013.01); *H01L 2224/8592* (2013.01); *H01L 2224/49* (2013.01); *H01L 2924/13055* (2013.01); *H01L 2924/13091* (2013.01); *H01L 24/45* (2013.01); *H01L 2224/45124* (2013.01); *H01L 2224/45139* (2013.01); *H01L 2224/45147* (2013.01); *H01L 2224/85205* (2013.01); *H01L 24/83* (2013.01); *H01L 24/85* (2013.01); *H01L 2224/73265* (2013.01); *H01L 2224/83801* (2013.01); *H01L 2224/8384* (2013.01); *H01L 2224/92247* (2013.01)  
USPC ........................... 257/683; 257/784; 257/687

(58) Field of Classification Search  
USPC .......... 257/678, 683, 687, 690, 784, 787, 790  
See application file for complete search history.

(56) References Cited

U.S. PATENT DOCUMENTS

| | | | | |
|---|---|---|---|---|
| 5,858,454 | A * | 1/1999 | Kiryu et al. ................. | 427/118 |
| 5,977,621 | A * | 11/1999 | Stuck ............................ | 257/683 |
| 7,514,777 | B2 * | 4/2009 | Kawaguchi et al. .......... | 257/687 |
| 2007/0085181 | A1 * | 4/2007 | Kroneder et al. ............. | 257/678 |

* cited by examiner

*Primary Examiner* — S. V. Clark  
(74) *Attorney, Agent, or Firm* — Murphy, Bilak & Homiller, PLLC

(57) ABSTRACT

A semiconductor module includes an electrically conductive lower contact piece and an electrically conductive upper contact piece spaced apart from one another in a vertical direction. The module further includes a semiconductor chip having a first load connection and a second load connection. The semiconductor chip is electrically conductively connected by the second load connection to the lower contact piece, and electrically conductively connected to the upper contact piece by at least one bonding wire bonded to the first load connection. An explosion protection means is arranged between the first load connection and the upper contact piece and into which each of the bonding wires is embedded over at least 80% or over at least 90% of its length.

29 Claims, 7 Drawing Sheets

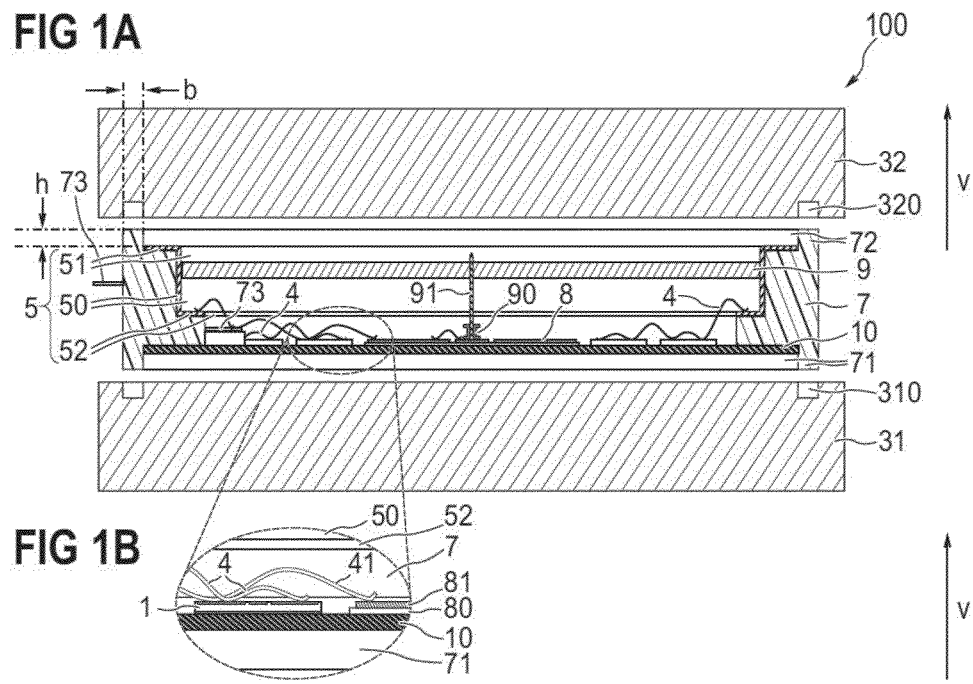
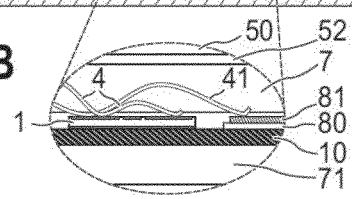
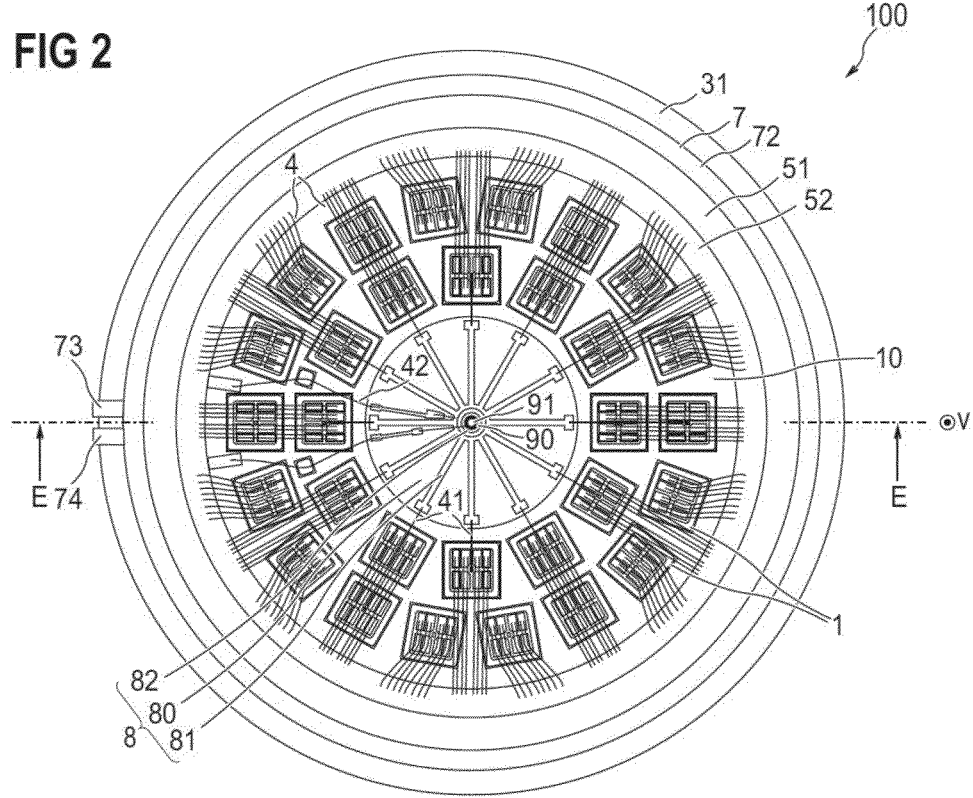

EXPLOSION-PROTECTED SEMICONDUCTOR MODULE

PRIORITY CLAIM

This application claims priority to German Patent Application No. 10 2012 211 446.7, filed on 2 Jul. 2012, the content of said German application incorporated herein by reference in its entirety.

TECHNICAL FIELD

The invention relates to semiconductor modules.

BACKGROUND

In many applications of semiconductor modules, an explosion of the module can damage or at least contaminate the environment in which the module is incorporated.

SUMMARY

Embodiments described herein provide a semiconductor module which has good explosion protection and which can be used in a wide variety of technical fields.

A semiconductor module according to one embodiment comprises an electrically conductive lower contact piece, and an electrically conductive upper contact piece spaced apart from the lower contact piece in a vertical direction. Furthermore, the module comprises one or more semiconductor chips. Each of the semiconductor chips has a first load connection and a second load connection. Moreover, each of the semiconductor chips is electrically conductively connected by its second load connection to the lower contact piece. Furthermore, the semiconductor module comprises an explosion protection means arranged between the first load connection and the upper contact piece and into which each of the bonding wires is embedded over at least 80% or over at least 90% of their length.

The explosion protection means acts as a heat sink for the bonding wire that vaporizes in the case of overload. As a result, the vaporization is delayed and the strength of a pressure wave arising as a result of the vapor pressure is significantly reduced in comparison with an identically constructed module without the explosion protection means. In this case, the explosion protection means can be chosen such that its thermal conductivity increases as the temperature increases, as is the case for example with SiO2 (silicon dioxide). Independently thereof, the explosion protection means can, for example, comprise pourable granules or be formed as pourable granules.

An alternative or supplementary measure for increasing the explosion protection can be realized by a construction that withstands the pressure arising within the interior of the module. This can be realized firstly by a housing side wall which has a lower projection on its side facing the lower contact piece, the lower projection engaging into a first groove of the lower contact piece, and/or which has an upper projection on its side facing the upper contact piece, the upper projection engaging into a second groove of the upper contact piece.

Yet another alternative or supplementary measure can realized by the semiconductor module having one or more gas-filled cavities in which pressure can be reduced by expansion. Since an explosion proceeds within a few microseconds, the pressure wave propagates virtually isothermally unless it is manipulated by the explosion protection means. In the isothermal range, the product of pressure and volume is constant. By providing a cavity which can trap part of the pressure wave during an explosion, it is possible to limit the total pressure established during an explosion.

In all configurations, the housing side wall can optionally be embodied as an integral or multipartite closed ring.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A shows a vertical section through a semiconductor module before lower and upper contact pieces are placed on to a ring-shaped housing side wall.

FIG. 1B shows an enlarged portion of the view in accordance with FIG. 1A.

FIG. 2 shows a plan view of the semiconductor module in accordance with FIG. 1A, with the upper contact piece removed and the covering removed.

DETAILED DESCRIPTION

Figure 3A:
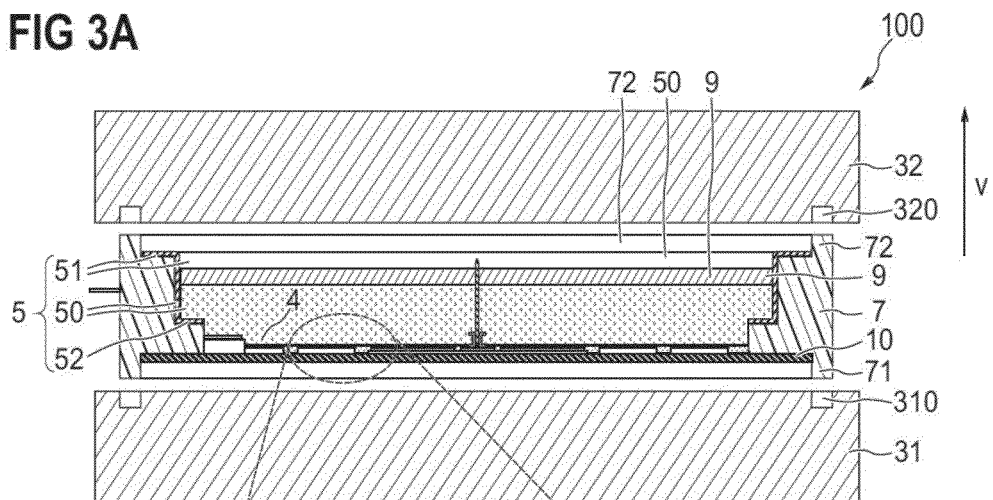
FIG. 3A shows the arrangement in accordance with FIG. 1A, but with illustration of a potting compound and an explosion protection means.

FIG. 1A shows a vertical section through a portion of a semiconductor module 100. The semiconductor module 100 comprises an electrically conductive lower contact piece 31 and an electrically conductive upper contact piece 32 spaced apart from one another in a vertical direction v, and a housing side wall 7 and a covering 9. The contact pieces 31 and 32 have not yet been placed on to the housing side wall 7 in FIG. 1A. Moreover, in order to clarify the internal module construction, a potting compound typically present in the semiconductor module 100 and the explosion protection means are not illustrated.

FIG. 1B shows an enlarged view of a portion of the arrangement in accordance with FIG. 1A, and FIG. 2 shows a plan view with the upper contact piece 32 and the covering 9 both removed. FIG. 2 likewise illustrates a sectional plane E-E of the view in accordance with FIGS. 1A and 1B.

The semiconductor module 100 contains a number of N≥1 semiconductor chips 1. The number N of semiconductor chips 1 is arbitrary, in principle. In all semiconductor modules described herein, e.g. N=1 can be chosen, or N≥2, or N≥4, etc.

Each of the semiconductor chips 1 has a first load connection 11 and a second load connection 12. The first load connection 11 and/or the second load connection 12 can be embodied as planar chip metallization(s), for example, applied to a semiconductor body 19 (for the reference signs "11", "12" and "19" see FIGS. 3B to 3G). The semiconductor chips 1 can be controllable semiconductor chips 1, for example, in which a current via a load path formed between the first load connection 11 and the second load connection 12 can be controlled with the aid of a control connection 13. By such a control connection 13, the load path of the respective semiconductor chip 1 can be wholly or partly opened or else turned off. Examples of suitable controllable semiconductor chips 1 are unipolar and bipolar transistors, for example IGBTs, MOSFETs, junction field effect transistors or thyristors. Depending on the type of the relevant semiconductor component 1, the first and second load connections 11, 12 are drain and source, source and drain, emitter and collector, collector and emitter, anode and cathode, or cathode and anode, respectively. Accordingly, depending on the type of semiconductor component 1, the control connection 13 is a gate connection or a base connection. However, a semiconductor component 1 need not necessarily be controllable. Thus, by way of example, a semiconductor component 1 can also be a diode, in which the first and second load connections 11, 12 constitute anode and cathode, or cathode and anode, respectively.

Within the meaning of the present invention, first load connection 11, second load connection 12 and control connection 13 are considered to be contact electrodes, for example metallization layers of a semiconductor chip 1 in which the relevant semiconductor component is integrated. The contact electrodes are applied to the semiconductor body 19 of the semiconductor chip 1 during the processing of the semiconductor chip 1, for example during the processing of a plurality of semiconductor chips 1 of an identical type in the wafer assemblage. Vertical semiconductor chips 1, in which the first load connection 11 and the second load connection 12 are situated on mutually opposite sides of the semiconductor chip 1, can particularly advantageously be used in the present invention. In principle, however, lateral semiconductor chips 1 can also be used, in which the first load connection 11 and the second load connection 12 are situated on the same side of the semiconductor chip 1.

If the N semiconductor components 1 are two or more semiconductor components, these can optionally be embodied identically. By way of example, by connecting in parallel the load paths of two or more—in particular identical—semiconductor chips 1, it is possible to increase the current-carrying capacity of the semiconductor module 100. In general, however, different types of semiconductor components 1 can also be incorporated and interconnected with one another in a semiconductor module 100 in any desired combinations in the manner described below.

One example of the combination of different semiconductor components 1 is the parallel connection of the load paths of one or more controllable semiconductor components with the load paths of one or more freewheeling diodes. Such a parallel connection comprising one or more controllable semiconductor components and one or more diodes can be used in power converters, for example. If two such parallel connections are connected in series, it is thereby possible to realize a half-bridge circuit, for example.

The semiconductor module 100 in accordance with FIG. 1A has an optional base plate 10, which serves as a carrier for all the semiconductor chips 1 incorporated in the semiconductor module 100. Moreover, one or more circuit carriers 8 can optionally be mounted on the base plate 10. The base plate 10, which can have a thickness e.g. in the range of 2 mm to 6 mm, is metallically conductive. The base plate 10 can consist of copper or molybdenum, for example. Optionally, the base plate 10 can also be present with cooling elements such as e.g. cooling ribs or cooling channels for a cooling fluid. In these cases, the thickness of the base plate 10 can also be in the range of 2 mm to 40 mm.

Since typical coefficients of linear thermal expansion of semiconductor materials from which the semiconductor chips 1 are produced are in the range of 4 ppm/K to 5 ppm/K, it is advantageous if the base plate 10 has a low coefficient of linear thermal expansion that is significantly lower than the coefficient of thermal expansion of copper (approximately 16.5 ppm/K). By way of example, the coefficient of linear thermal expansion can be less than 10 ppm/K; by way of example, it can be in the range of 4 ppm/K to 8 ppm/K. Such low coefficients of expansion can be achieved e.g. with metal matrix composite materials (MMC), with a trimetal, or with metal-infiltrated ceramic. Examples of suitable metal matrix composite materials are aluminum silicon carbide (AlSiC), copper silicon carbide (CuSiC), aluminum carbide (AlC), copper-molybdenum (CuMo), magnesium silicon carbide (MgSiC) and copper-tungsten (CuW). A suitable trimetal can be e.g. Fe—Cu—Fe (a copper layer arranged between two iron layers). Metal-infiltrated ceramics are porous ceramics whose pores were wholly or partly filled with a liquid metal, which was then cooled to below its melting point. The metal can be, for example, aluminum, an aluminum alloy, copper or a copper alloy. Suitable ceramics are e.g. aluminum oxide (Al2O3), silicon carbide (SiC), aluminum nitride (AlN), or other ceramics.

The semiconductor chips 1 can be mounted on the base plate 10 with the aid of a connecting layer 15, by which the semiconductor chip 1 is cohesively connected to the base plate 10 at its side facing the base plate 10. For this purpose, the connecting layer 15 can make contact with both the second load connection 12 of the semiconductor chip 1 and the base plate 10 and cohesively connect them to one another. Suitable connecting layers 15 are, for example, solder layers, sintering layers or adhesive layers. Particularly in the case of vertical semiconductor chips 1, the connecting layers 15 can also be electrically conductive, such that the second load connection 12 is electrically conductively connected to the base plate 10 by the connecting layer. In this way, the second load connections 12 of two or more semiconductor chips 1 mounted on the base plate 10 can be electrically conductively connected to one another via the base plate 10.

The housing side wall 7 can optionally be embodied as a closed ring. In this case, a "closed ring" is considered to be not only integrally embodied ring forms, in which a uniform material or a homogeneous material mixture forms a closed ring, but also ring forms composed of two or more side wall segments. Within the meaning of the present invention, "rings" are not restricted to configurations having an annular basic contour. By way of example, the rings can also have a rectangular or arbitrary other basic contour. In the case of two or more assembled side wall segments, these can be connected to one another in a positively locking manner (e.g. with the aid of undercut connections) and/or cohesively (e.g. by adhesive bonding) to form a ring-shaped side wall 7.

Independently of whether a ring-shaped housing side wall 7 is formed from a uniform material or a homogeneous material mixture or else is composed of two or more side wall segments, the integral side wall 7 or the individual side wall segments can be produced in each case by an injection-molding method in which a molding compound for producing the housing side wall 7 or the side wall segments is injected into a negative mold and subsequently cured. The electrically insulating housing side wall 7 or the side wall segments can consist of plastic, for example. Suitable plastics are e.g. thermosetting plastics or thermoplastics. As an alternative to an electrically insulating housing side wall 7 consisting of a uniform material, the housing side wall 7 can also consist of a mixture of a plastic, for example a thermosetting plastic or a thermoplastic, and granules. In this case, the proportion of granules can, for example, be 10% by volume to 90% by volume. Suitable granules are, for example, ceramics such as aluminum oxide (Al2O3) or silicon carbide (SiC), glasses, silicon dioxide, or arbitrary mixtures of such materials. The fillers improve the insulation strength and the mechanical strength. That is advantageous because the housing has to insulate between base plate and load connection even at high electrical voltages. Moreover, the contact pieces 31 and 32 are pressed against the edge of the housing side wall 7 in order to guarantee the electrical contact. For this purpose, the plastic must have a high long-term stability and a low tendency toward creep.

In order to impart a particularly high mechanical stability to the housing side wall 7, the housing side wall 7 can have an average thickness of at least 5 mm. In this case, the thickness should be measured perpendicular to the vertical direction v.

An electrically conductive contact plate 5 is fixed to the inner side of the housing side wall 7, the inner side being embodied in a stepped fashion. The electrically conductive contact plate 5 likewise is embodied in a stepped fashion and has a first shoulder 51 and a second shoulder 52, which is connected to the first shoulder 51 by a portion 50. The fixing can be effected e.g. by adhesive bonding, pressing, latching or by partial encapsulation by injection molding.

The first load connections 11 of the semiconductor chips 1 are in each case electrically conductively connected to the contact plate 5 by one or more bonding wires 4. For this purpose, each of the bonding wires 4 is bonded on to the first load connection 11 of the respective semiconductor chip 1 at a first location and on to the second shoulder 52 of the contact plate 5 at a second location. A suitable connecting technique is ultrasonic wire bonding, for example, in which a direct cohesive connection is produced between the bonding wire 4 and the relevant first load connection 11, and between the bonding wire 4 and the second shoulder 52. In this case, the distance between the second shoulder 52 and the first load connection 11 of each of the semiconductor chips 1 can be less than 25 mm.

One, a plurality or all of the bonding wires 4 of the semiconductor module 100 which are bonded directly on to a first load connection 11 of one of the semiconductor chips 1 can in this case be bonded on to the second shoulder 52 such that the bonding wire 4, between its bonding location situated closest to the relevant semiconductor component 1—along the course of the bonding wire 4—on the second shoulder 52, and its bonding location situated closest to the second shoulder 52—along the course of the bonding wire 4—on the relevant first load connection 11, no longer has a further bonding location. To put it another way, such a bonding wire 4 has no bonding locations, i.e. no support points, between all its bonding locations on the first load connection 11 and all its bonding locations on the second shoulder 52 along its bonding wire course.

Figure 3B:
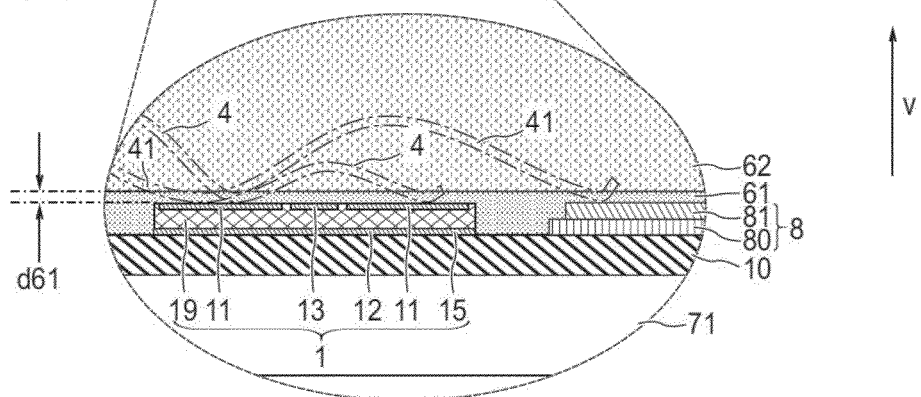
FIG. 3B shows an enlarged portion of the view in accordance with FIG. 3A.

In order to increase the electrical insulation capability of the semiconductor module 100, the semiconductor module 100 can optionally—as is shown in FIGS. 3A and 3B—be provided with a potting compound 61, e.g. a silicone-based potting compound, which extends from the top side—facing the upper contact piece 32—of the base plate 10 at least as far as over the first load connections 11 of the semiconductor chips 1, such that the semiconductor chips 1, with the exception of the locations at which bonding wires 4 or possible other connecting elements are fitted to the respective first load connection 11, are completely covered by the potting compound 61. The course of the concealed bonding wires 4 is illustrated by broken lines in the view in accordance with FIG. 3B. The potting compound 61 can have, for example, a penetration of less than 30. By virtue of the fact that the potting compound 61 covers the semiconductor chips 1 as explained and thus forms a cover layer, the potting compound 61 also protects the semiconductor chips 1 against damage by an explosion protection means 62 explained in more detail further below.

Figure 3C:
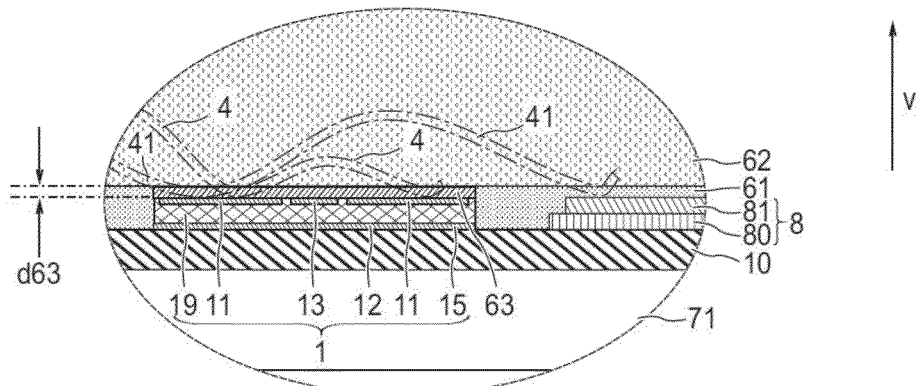
FIG. 3C shows an enlarged portion of the view in accordance with FIG. 3A, which corresponds to the enlarged portion in accordance with FIG. 3B and differs therefrom in that a polyimide layer is arranged above the semiconductor chips.
Figure 3D:
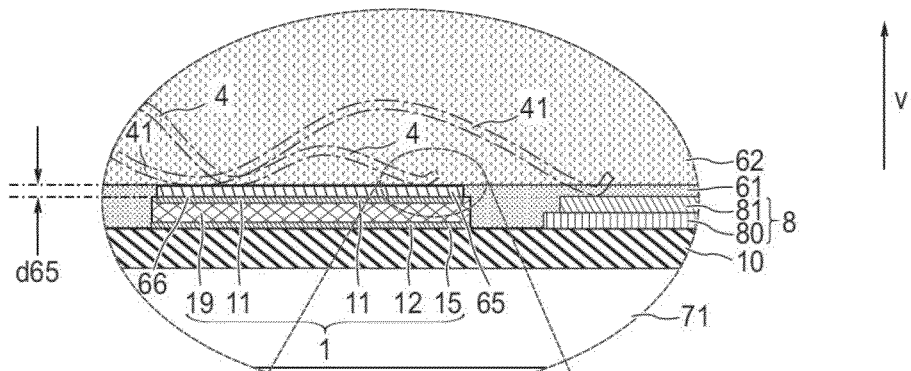
FIG. 3D shows an alternative configuration of the portion in accordance with FIG. 3C, in which an electrically conductive metallic cover layer is applied to the first load connection.

As is furthermore shown in FIG. 3C, a cover layer 63 which completely covers the semiconductor chips 1 with the exception of the locations at which bonding wires 4 or possible other connecting elements are fitted to the respective first load connection 11 and thus protects the relevant semiconductor chip 1 against damage by the explosion protection means 62, can also consist of polyimide or some other material. If a cover layer 63 composed of a potting compound 61, a polyimide or some other material is used, a potting compound 61 outside the cover layer 63 can optionally be dispensed with.

Furthermore, there is also the possibility of assembling a cover layer 63 from sublayers which in each case cover the top side of the semiconductor chip 1. By way of example, firstly a polyimide layer can be applied to the top side of the semiconductor chip 1 and a layer composed of a potting compound 61 can be applied on said polyimide layer.

Generally, a cover layer 63, independently of whether it is formed by a potting compound 61, by a polyimide or some other material, can have a penetration of less than or equal to 30.

The layer thickness d61 of the potting compound 61 above the semiconductor chips 1 or the layer thickness d63 of the polyimide layer 63 above the semiconductor chips 1 can be, for example, at most 3 times, e.g. 1 to 3 times, the nominal diameter of the thickest of the bonding wires 4 bonded on to the first load connection 11 of the relevant semiconductor component 1. In this case, the nominal diameter is considered to be the diameter of the bonding wire 4 outside bonding locations.

In the case of bonding wires 4 not having a round cross section, for example in the case of bonding wires 4 embodied as a flat ribbon, the thickness of the bonding wire 4 is considered to be the smallest thickness of the bonding wire in a sectional plane perpendicular to its direction of progression outside bonding locations.

In any case, the potting compound 61, at least at the bonding location at which a bonding wire 4 is bonded on to a first load connection 11, extends as far as the level of that side of the bonding wire 4 which faces the upper contact piece 32.

Situated above the potting compound 61 is an explosion protection means 62, into which the bonding wires 4 are embedded in their portions situated above the potting compound 61. The explosion protection means 62 can be, for example, formed as pourable granules or comprise pourable granules. "Pourable" means that the individual particles of the granules are not fixed relative to one another by a matrix material.

The explosion protection means 62 is electrically insulating in any case. Suitable materials for the explosion protection means 62 are, for example, ceramic granules and/or glass granules, e.g. composed of Al2O3or SiO2, ZrO2; SiC; AlN; Si4N. In particular, sand (likewise a material in the form of granules) can be used as explosion protection means 62. Very fine-grained granules, i.e. a powder, can likewise be used. In the case of granules, the grains of the granules can have an average diameter of less than or equal to 500 μm.

The explosion protection means 62 serves, in the event of an explosive vaporization of a bonding wire 4, such as can be caused for example by a high current through the bonding wire 4, to prevent or at least dampen an arc and to limit the plasma channel that forms. The same also applies if the chip overheats to such an extent that its constituents vaporize and contribute to the formation of a plasma channel.

The fact that the semiconductor components 1 are covered with the potting compound 61 or some other cover layer 63 prevents the explosion protection means 62 from coming into direct contact with the semiconductor chips 1 and damaging them. Optionally, the potting compound 61 can have a penetration of less than or equal to 30, such that the explosion protection means 62 is prevented particularly well from penetrating excessively far into the potting compound 61.

The base plate 10 together with the housing side wall 7 form a beaker-shaped container for accommodating the potting compound 61 and the explosion protection means 62.

The covering 9 is situated on that side of the explosion protection means 62 which faces the upper contact piece 32. The covering 9 serves to hold the explosion protection means 62 in the beaker-shaped container. For this purpose, the covering 9 seals the container in such a way that between the covering 9 and the contact plate 5 no gap remains, or at most a small gap remains which is small enough to prevent the emergence of the explosion protection means 62. For sealing purposes, the covering 9 can be cohesively connected to the contact plate 5 for example by means of a ring-shaped connecting layer. Suitable connecting layers include soldering, welding or adhesive layers, for example. Instead of being sealed by a cohesive connection, a gap between the covering 9 and the contact plate 5 can also be sealed by an electrically conductive or an electrically insulating seal. The covering 9 can be either electrically conductive or electrically insulating. If the covering 9 is electrically conductive, it can be electrically conductively connected to the contact plate 5. For this purpose, e.g. a solder layer or an electrically conductive adhesive layer can be used as connecting layer.

Instead of or in addition to a cover layer 63, an electrically conductive, metallic cover layer 65 can also be provided, as is shown in the portion in accordance with FIG. 3C corresponding to FIG. 3B. The metallic cover layer 65, which is applied to that side of the first load connection 11 which faces away from the second load connection 12 and is both cohesively and electrically conductively connected to the first load connection 11, can completely cover the first load connection 11. The metallic cover layer 65 serves to protect in particular the semiconductor body 19 of the semiconductor chip 1 against damage by the explosion protection means 62 if the explosion protection means 62 bears directly against that side of the metallic cover layer 65 which faces away from the second load connection 12.

Moreover, the metallic cover layer 65 can be used for making electrical contact with the first load connection 11. As can be discerned for example in FIG. 3D and the enlarged portion in accordance with FIG. 3E, e.g. a bonding wire 4 can be bonded by wire bonding directly on to that side of the first load connection 11 which faces away from the second load connection 12.

The fixing of the electrically conductive, metallic cover layer 65 on the first load connection 11 is effected by means of an electrically conductive connecting layer 66, which directly adjoins both the cover layer 65 and the first load connection 11. The electrically conductive connecting layer 66 can be embodied as a solder layer, for example, or as a layer comprising a sintered metal powder, for example a silver powder. In the case of a solder layer, the latter can comprise tin, for example, and/or an intermetallic copper-tin phase.

Optionally, an electrically conductive, metallic cover layer 65 can consist of a uniform metal, e.g. molybdenum or copper, or of a homogeneous alloy, or it can comprise at least one metal, e.g. molybdenum or copper. The thickness d65 of the cover layer 65 can be for example 0.2 mm to 2.0 mm in the case of molybdenum, or 0.1 mm to 0.5 mm in the case of copper.

Figure 3E:
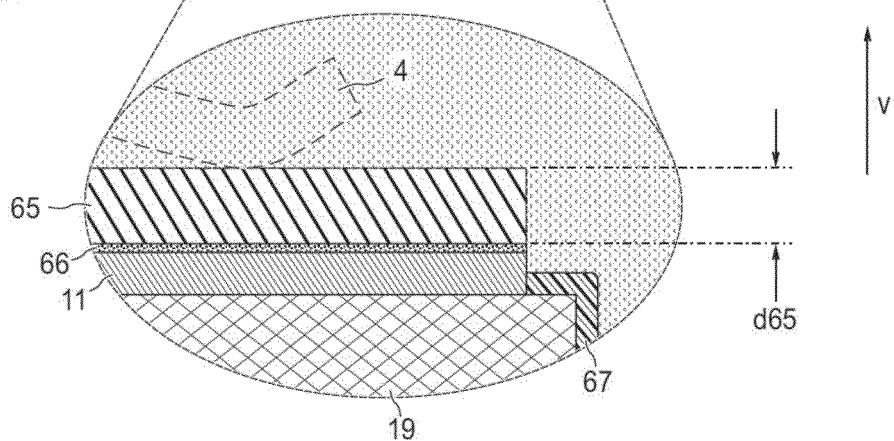
FIG. 3E shows an enlarged view of a portion of the arrangement in accordance with FIG. 3D.
Figure 3F:
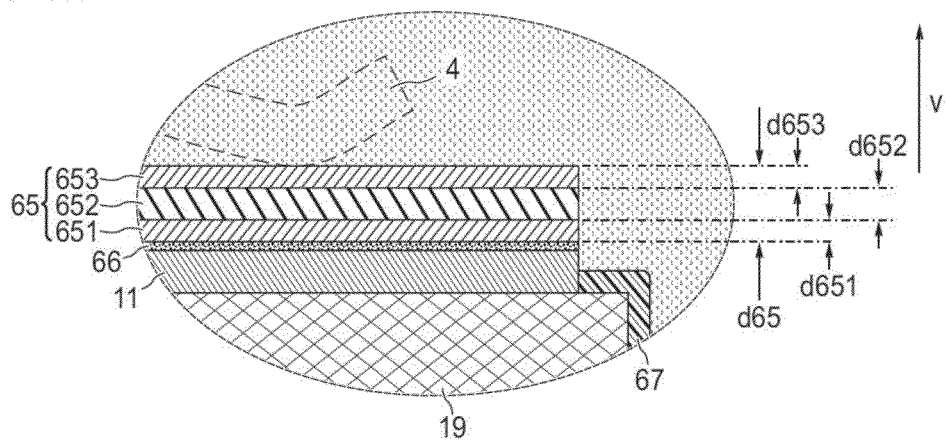
FIG. 3F shows an alternative configuration of the portion in accordance with FIG. 3E, in which the electrically conductive metallic cover layer has three sublayers.

As is furthermore shown in FIG. 3F, the metallic cover layer 65 can alternatively also be embodied as a trimetal layer and comprise a first metallic sublayer 651, a second metallic sublayer 652 and a third metallic sublayer 653, which are arranged in the stated order successively on the first load connection 11, such that the second metallic sublayer 652 is arranged between the first metallic sublayer 651 and the third metallic sublayer 653. A cover layer 65 of this type can be produced for example by the sublayers 651, 652 and 653 being rolled with one another. The fixing of the cover layer 65 embodied as a trimetal layer on the first load connection 11 can be effected with the aid of connecting layer 66, the construction and production of which have already been described with reference to FIG. 3E. Optionally, the first metallic sublayer 651 and the third metallic sublayer 653 can comprise the same material or consist of the same material. The thickness d65 of a cover layer 65 embodied as a trimetal layer can be 0.2 mm to 2.0 mm, for example.

As an alternative or in addition to a cover layer 63 or 65, the first load connection 11 can also be configured with a particularly large thickness d11, for example in the range of 7 μm to 100 μm, preferably in the range of 10 μm to 40 μm, in order to protect the semiconductor body 19 against damage by the explosion protection means 62. In the case of a configuration of this type, the explosion protection means 62 can bear directly against that side of the first load connection 11 which faces away from the second load connection 12. The first load connection 11 can consist of copper or aluminum, for example, or of an alloy comprising copper and/or aluminum.

The production of a first load connection 11 having a high thickness d11 can be effected, for example, by the material of the first load connection 11 being applied to the semiconductor body 19 by electrodeposition or by sputtering.

Figure 4:
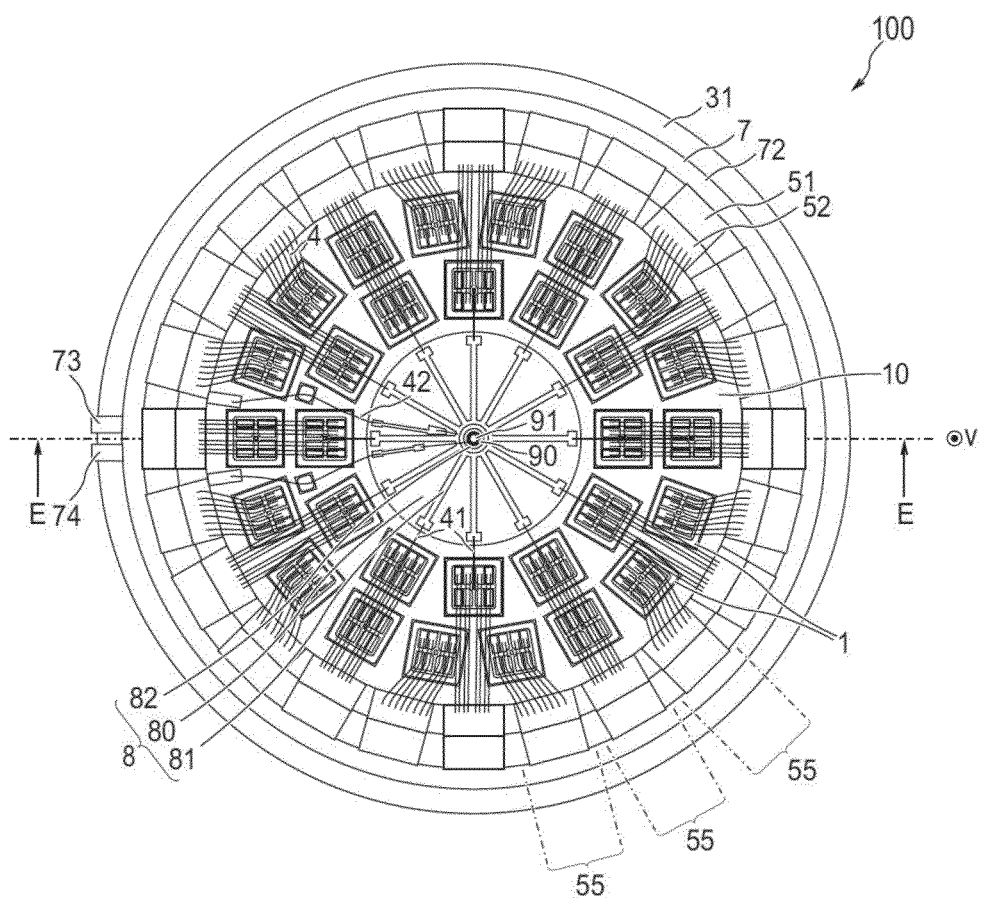
FIG. 4 shows a plan view of a semiconductor module which differs from the semiconductor module in accordance with FIG. 2 in that it has, instead of an integral contact plate, a contact plate composed of a multiplicity of subplates.

As is evident from a further configuration of a semiconductor module as shown in FIG. 4, instead of an integrally formed contact plate 5 such as is shown in FIG. 2, for example, a number of subplates 55 separated from one another can be provided, each of which has a first shoulder 51, and a second shoulder 52, which is connected to the first shoulder 51 of the relevant subplate 55 by a portion 50 (see FIG. 1A). The individual subplates 55 can be placed on to the housing side wall 7 or be inserted into the latter, for example with the aid of a guide rail, such that adjacent subplates 55 are spaced apart from one another or bear against one another. Moreover, the different subplates 55 are electrically conductively connected to one another. The number of subplates 55 is arbitrary, in principle. It can be for example greater than or equal to 2, greater than or equal to 4, but also greater than 4. Through the use of the number of subplates 55, with regard to the electrical interconnection it is possible to realize the same functions as have already been explained above for the contact piece 5 in accordance with FIGS. 1A, 1B and 2. The use of a multiplicity of subplates 55 separated from one another consists in simpler production. In the simplest case, it is merely necessary for a simple elongated metal strip to be bent over twice in order to form the two shoulders 51 and 52.

Figure 3G:
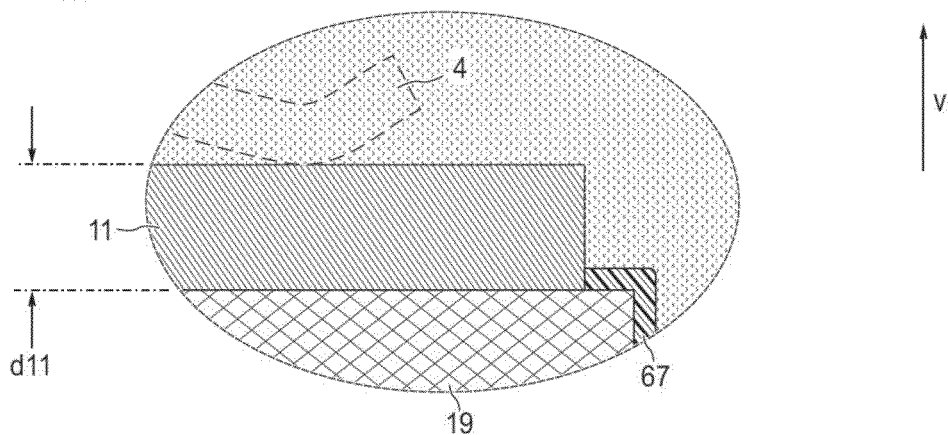
FIG. 3G shows an alternative configuration of the portion in accordance with FIG. 3E, in which the first load connection has a large thickness.

As is furthermore evident from FIGS. 3E, 3F and 3G, the semiconductor body 19 can be covered by a dielectric 67 at least in the regions of its front side facing away from the second load connection 12 which are not already covered by the first load connection 11. Optionally, the dielectric 67 can also extend without interruption around the edge between the front side and the ring-shaped circumferential side face of the semiconductor body 19 right on to the side face. By way of example, silicone or polyimide is suitable as material for the dielectric.

Figure 5:
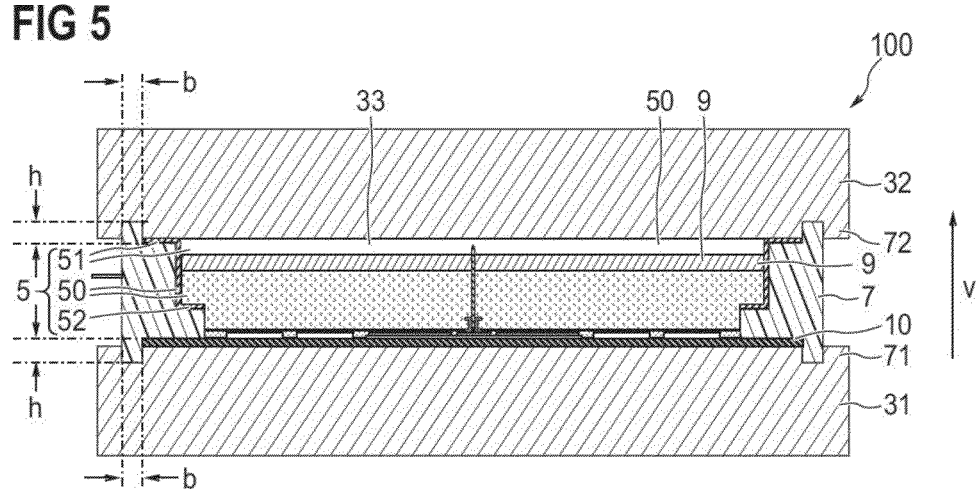
FIG. 5 shows a vertical section through the semiconductor module in accordance with FIG. 3A with potting compound filled in and explosion protection means filled in, and after the lower and upper contact pieces have been placed on to the ring-shaped housing side wall.

FIG. 5 shows the arrangement in accordance with FIG. 3A after the lower contact piece 31 and the upper contact piece 32 have been mounted on the housing side wall 7. For the mechanical stabilization of the semiconductor module 100, the housing side wall 7 can optionally have a first projection 71 at its side facing the lower contact piece 31, the first projection 71 engaging into a first groove 310 of the lower contact piece 31, and/or a second projection 72 at its side facing the upper contact piece 32, the second projection 72 engaging into a second groove 320 of the upper contact piece 32. Mounting is realized such that the lower contact piece 31 and the upper contact piece 32 are placed on to the housing side wall 7 by the first projection 71 being inserted into the first groove 310 and/or the second projection 72 being inserted into the second groove 320. The first projection 71 and/or the second projection 72 can optionally have a width b of at least 3 mm and a height h of at least 1 mm.

Optionally, the lower projection 71 and/or the upper projection 72 and the first groove 310 and/or the second groove 320 can be embodied in each case as a closed ring, i.e. the first projection 71 can engage into the first groove 310 over its entire circumference and/or the second projection 72 can engage into the second groove 320 over its entire circumference. The engagement of the projections 71 and/or 72 into the relevant grooves 310 and/or 320, respectively, mechanically stabilizes the housing side wall 7 perpendicularly to the vertical direction v relative to the contact pieces 31 and/or 32, respectively.

By virtue of the upper contact piece 32 being placed on to the housing side wall 7, the upper contact piece 32 makes electrically conductive contact with the contact plate 5 at the upper shoulder 51 thereof. In order to achieve the largest possible contact area between the first shoulder 51 and the upper contact piece 32, the first shoulder 51 can optionally have an annular basic area. The electrical contact between the upper contact piece 32 and the first shoulder 51 can be a pressure contact, for example, which is produced by the upper contact piece 32 being pressed against the contact plate 5 in the direction of the housing side wall 7. Instead of a pressure contact connection, the upper contact piece 32 can be cohesively electrically conductively connected to the first shoulder 51 for example by a solder or sintering layer.

Correspondingly, the electrical contact between the lower contact piece 31 and the base plate 10 can be a pressure contact produced by the lower contact piece 31 being pressed against the base plate 10 in the direction of the housing side wall 7. Instead of a pressure contact connection, the lower contact piece 31 can be cohesively electrically conductively connected to the base plate for example by a solder or sintering layer. In this case, the type of electrical connection between the lower contact piece 31 and the base plate 10 can be chosen independently of the type of electrical connection between the upper contact piece 32 and the contact plate 5.

In the case of at least one, a plurality or even all of the semiconductor chips 1 of a semiconductor module 100 according to the present invention, the respective first load connection 11 is electrically conductively connected to the upper contact piece 32 and the respective second load connection 12 is electrically conductively connected to the lower contact piece 31. This enables electrical contact to be made with the semiconductor module 100 in a simple manner by the semiconductor module 100 being inserted into an appropriate pressure contact mount having electrical connections corresponding to the contact pieces 31 and 32.

In the case of the semiconductor module 100 shown, moreover, an optional printed circuit board 8 is arranged on the base plate 10. The printed circuit board 8 comprises an electrically insulating insulation carrier 80 having a structured metallization layer on its side facing away from the base plate 10. The printed circuit board 8 can involve a ceramic substrate, for example, i.e. a printed circuit board 8 whose insulation carrier 80 consists of a ceramic. By way of example, the printed circuit board 8 can be embodied as a DCB (Direct Copper Bonding) substrate, as an AMB (Active Metal Brazed) substrate or as a DAB (Direct Aluminum Bonding) substrate.

By way of example, a star-shaped conductor track structure 81 and a conductor area 82 and further conductor tracks are formed in the structured metallization. In principle, however, the configuration of the structured metallization layer is arbitrary. Using bonding wires 41, the control connections 13 of the controllable chips from among the semiconductor chips 1 are connected to the star-shaped conductor track structure 81, which is in turn electrically conductively connected, inter alia by means of bonding wires 42, to a control connection 73 of the semiconductor module 100, the control connection 13 being led laterally through the housing side wall 7.

An electrically conductive contact pin 91 is electrically conductively connected to the conductor area 82. For this purpose, the pin 91 can be inserted into an electrically conductive sleeve 90 that is soldered on to the conductor area 82. The covering 9 is pressed on to the upper end of the pin 91, the covering 9 being provided with a press-fit opening for this purpose. Moreover, the covering 9 is electrically conductively connected to the contact plate 5 and thus to the first load connections 11 of the semiconductor chips 1, and the load connections 11 thereof are bonded on to the second shoulder 52 via the bonding wires 4. The first load connections 11 are thereby connected to the conductor area 82, which is in turn electrically conductively connected to an auxiliary connection 74, which is led laterally through the housing side wall 7.

A control voltage for driving the semiconductor module 100 can be applied between the auxiliary connection 74 and the control connection 73. The reference potential with respect to which the semiconductor chips 1 connected to the control connection 73 are driven is respectively present at the auxiliary connection 74. As a result of the symmetrical construction and the central arrangement of the contact pin 91, during the operation of the semiconductor module 100 there are at most very small potential shifts between the different load connections 11 connected to the contact plate 5. Such potential shifts can be caused by strong electric currents between the lower contact piece 31 and the upper contact piece 32. The only very small potential shifts in the present case have the effect that the semiconductor chips 1 connected to the contact plate 5, if they are of the same type or at least exhibit the same switching behavior, are switched on and off substantially synchronously.

A further, alternative or supplementary measure for increasing the explosion safety is likewise shown on the semiconductor module 100 in accordance with FIG. 5. The measure consists in keeping available a gas-filled cavity 33, in which the pressure rising during an explosion can be reduced by expansion. The gas can be air, for example. In the case of the arrangement shown, the cavity 33 is situated between the covering 9 and the upper contact piece 32. In the case of an explosion, the pressure rises in the region between the lower contact piece 31 and the covering 9, as a result of which the covering 9 is bent in the direction of the upper contact piece 32 and the volume of the cavity 33 is reduced. In this case, the rise in pressure brought about by the explosion is limited. The volume of the cavity 33, which volume should be determined with the upper contact piece 32 placed completely on to the housing frame 7, can be at least 10 cm$^3$.

Figure 6:
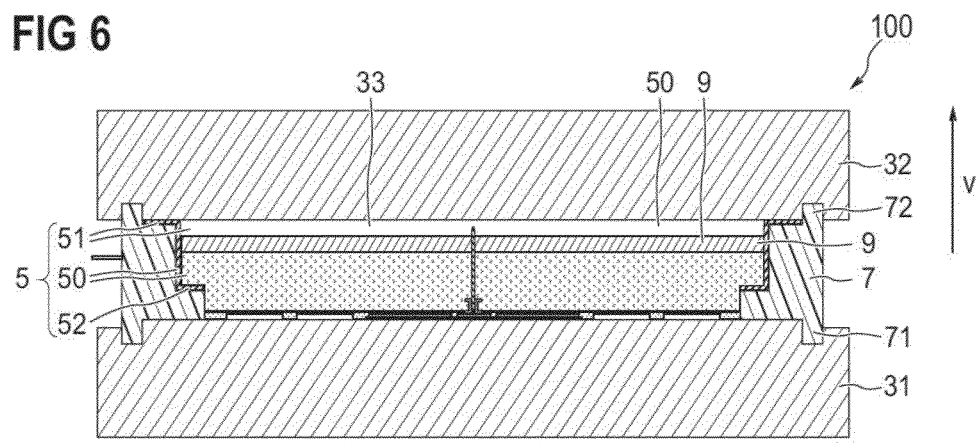
FIG. 6 shows an alternative configuration of a semiconductor module, which differs from the semiconductor module in accordance with FIG. 5 in that a separate base plate is dispensed with and the function thereof is performed by the lower contact piece.

In accordance with an alternative configuration, shown by way of example in FIG. 6, a separate base plate 10 can also be dispensed with. In this case, the lower contact piece 31 performs all of the above-described functions of the base plate 10. For the rest, the arrangement in accordance with FIG. 6 is identical to the arrangement in accordance with FIG. 5.

Figure 7:
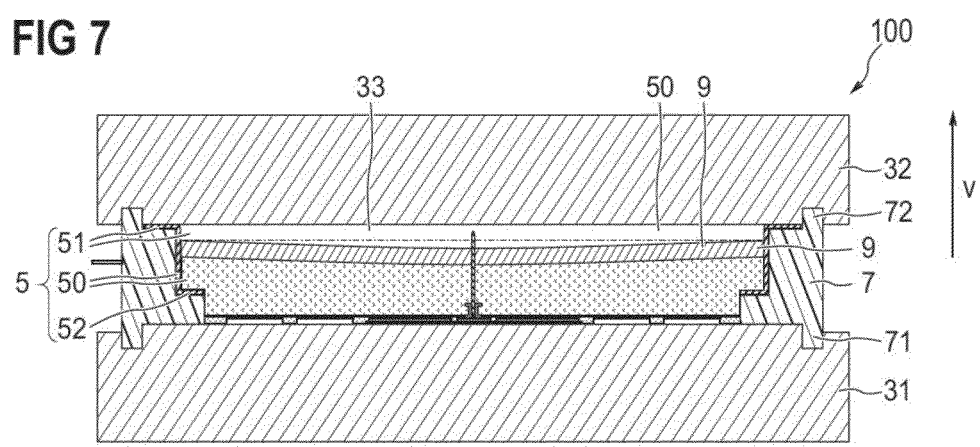
FIG. 7 shows an alternative configuration of a semiconductor module, which differs from the semiconductor module in accordance with FIG. 6 in that a covering is prestressed convexly in the direction of the lower contact piece above the explosion protection means.

As is furthermore shown in FIG. 7, a covering 9, independently of whether it is electrically conductive or electrically insulating, and independently of the remaining configuration of the semiconductor module 100, can optionally have a mechanical prestress by which the explosion protection means 62 is pressed in the direction of the lower contact piece 31, thereby avoiding the formation of relatively large voids in the explosion protection means 62. In order to produce such a prestress, the covering 9 can be embodied as a plate that is bent convexly in the direction of the lower contact piece 31. Moreover, such a convexly prestressed covering 9 can flex in the direction of the upper contact piece 32 in the case of a wire explosion of a bonding wire 4 and thus directionally reduce the resultant excess pressure. A covering 9 with prestress can also be used in all the semiconductor modules 100 having a base plate 10, in particular in those such as have been explained above with reference to FIGS. 1A to 5.

In order that, in the case of an overload of the semiconductor module 100, a first load connection 11 is prevented from being destroyed, rather a bonding wire 4 bonded on to the first load connection 11 is destroyed instead, the first load connection 11 can be embodied as thick metallization and/or consist of copper or a copper alloy. For this purpose, the first load connections 11 of the semiconductor chips 1 can have a thickness of at least 5 μm.

By contrast, the bonding wires 4 can consist of a material having a high melting point, e.g. of copper, a copper alloy, silver or a silver alloy, such that a large part of the energy that arises in the event of an overload of the semiconductor module 100 is consumed for vaporizing the bonding wire material. However, aluminum or an aluminum alloy can also be used as material for the bonding wires 4.

In all of the semiconductor modules 100 explained above, the first contact piece 31 and/or the second contact piece 32 consist(s) of materials having good electrical conductivity, for example of copper or aluminum completely or to the extent of at least 99% by weight, or of a metal matrix composite material (MMC) completely or to the extent of at least 99% by weight. Examples of suitable metal matrix composite materials are aluminum silicon carbide (AlSiC), copper silicon carbide (CuSiC), aluminum carbide (AlC), copper-molybdenum (CuMo), magnesium silicon carbide (MgSiC) and copper-tungsten (CuW). Alongside metal matrix composite materials in general, as special form metal-infiltrated ceramics are also suitable, i.e. porous ceramics whose pores were filled wholly or partly with a liquid metal, which was then cooled to below its melting point. The metal can be for example aluminum, an aluminum alloy, copper or a copper alloy. Suitable ceramics are e.g. aluminum oxide (Al2O3) or other ceramics. With metal-infiltrated ceramics of this type, it is likewise possible to produce contact pieces 31, 32 having a very low coefficient of thermal expansion.

The use of a lower contact piece 31 having a low coefficient of linear thermal expansion, that is to say a coefficient of linear thermal expansion that is significantly less than 17 ppm/K, preferably less than 10 ppm/K, such as can be obtained with the abovementioned MMC materials or the metal-infiltrated ceramics, is advantageous particularly when the semiconductor module 100 has no base plate 10.

Figure 8:
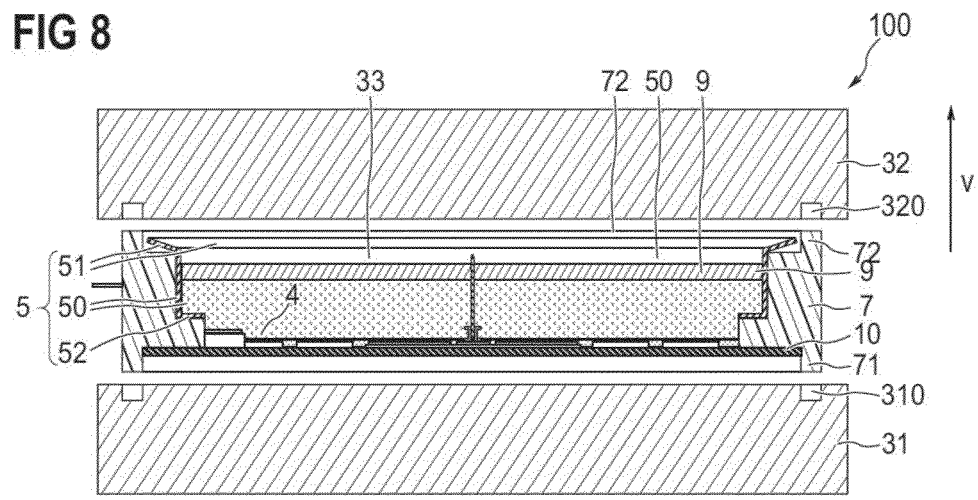
FIG. 8 shows an alternative configuration of a semiconductor module, which differs from the semiconductor module in accordance with FIG. 5 in that a part of a contact plate is embodied as a spring.

In order to obtain a particularly good electrical contact between the upper contact piece 32, the first shoulder 51 of the contact plate 5 can be embodied as a spring, such that when the upper contact piece 32 has not been placed on to the housing frame 7, a spring excursion remains between the first shoulder 51 and the housing frame 7, such that when the upper contact piece 32 is placed on to the housing frame 7, the first shoulder 51 is pressed counter to the spring force in the direction of the housing frame 7. FIG. 8 shows such a configuration by way of example. After the placement of the contact piece 32, the first shoulder 51 can bear completely against the housing frame 7, as is shown in FIGS. 5 to 7. In order to obtain a sufficient spring action, it is advantageous if the contact plate 5 consists of a suitable spring material such as e.g. CuFe2P or CuZr.

Figure 9:
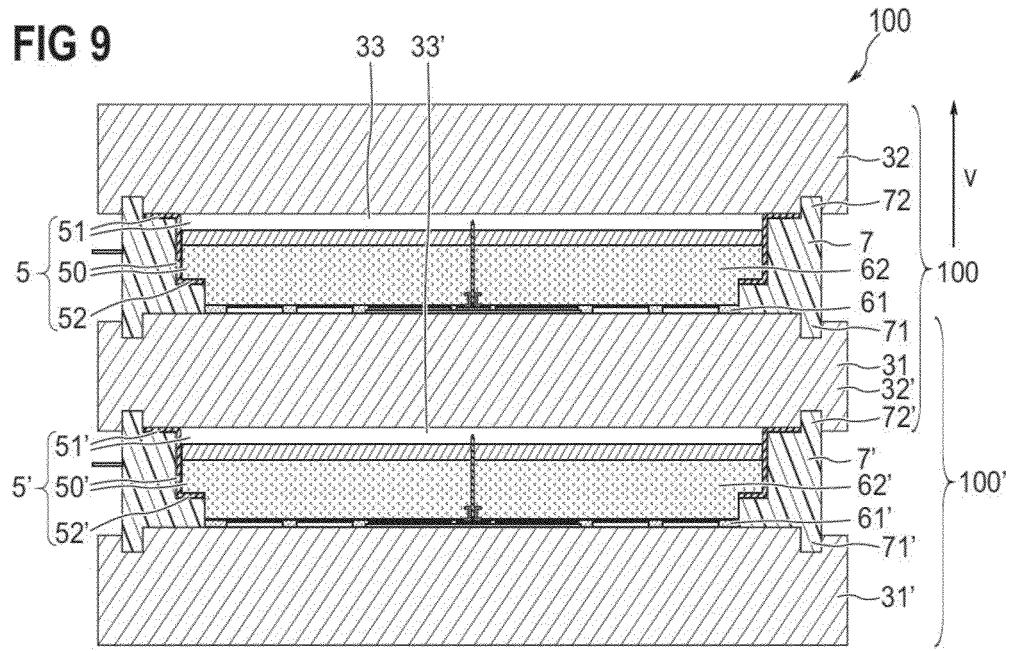
FIG. 9 shows a multiple semiconductor module comprising two semiconductor modules arranged one behind the other and each having a construction explained with reference to the previous figures, wherein the lower contact piece of a first one of the semiconductor modules is identical to the upper contact piece on a second one of the semiconductor modules.

As is furthermore explained by way of example with reference to FIG. 9, according to the principles explained above two or more semiconductor modules 100, 100' can also be connected in series, wherein it is advantageous if the lower contact piece 31 of the first semiconductor module 100 is identical to the upper contact piece 32' of the second semiconductor module 100'. In FIG. 9, all reference signs provided with a prime designate the same elements as the same reference signs without a prime in FIGS. 1A to 7. The prime merely indicates that a component of the second semiconductor module 100' is involved. The first semiconductor module 100 and the second semiconductor module 100' here are in each case constructed—independently of one another—according to one of the embodiments explained above.

Independently of whether or not the first shoulder 51 is embodied in a resilient fashion, the regions of the first shoulder 51 and of the upper contact piece 32 which make contact with one another when the contact piece 32 has been replaced can be provided in each case with a thin metallization in order to improve the contact-making. Suitable metallization combinations are, for example, silver graphite AgC having a graphite proportion of 3 atom % to 5 atom % and secondly AgCu3 or CuC having a graphite proportion of 3 atom % to 7 atom %. However, AgPd10...30, PdNi10...30, Ni hardened Au layers and so on are also conceivable. In this case, the metallization of the upper contact piece 32 and the metallization of the first shoulder 51 can consist of identical or an arbitrary combination of the materials mentioned.

Figure 10:
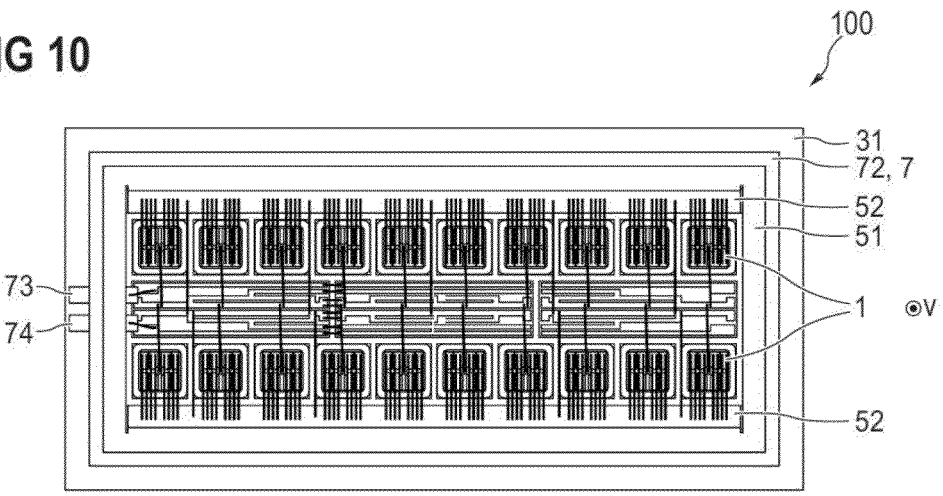
FIG. 10 shows a plan view of a first embodiment of a semiconductor module having a substantially rectangular basic contour, with the upper contact piece removed and with the potting compound removed.
Figure 11:
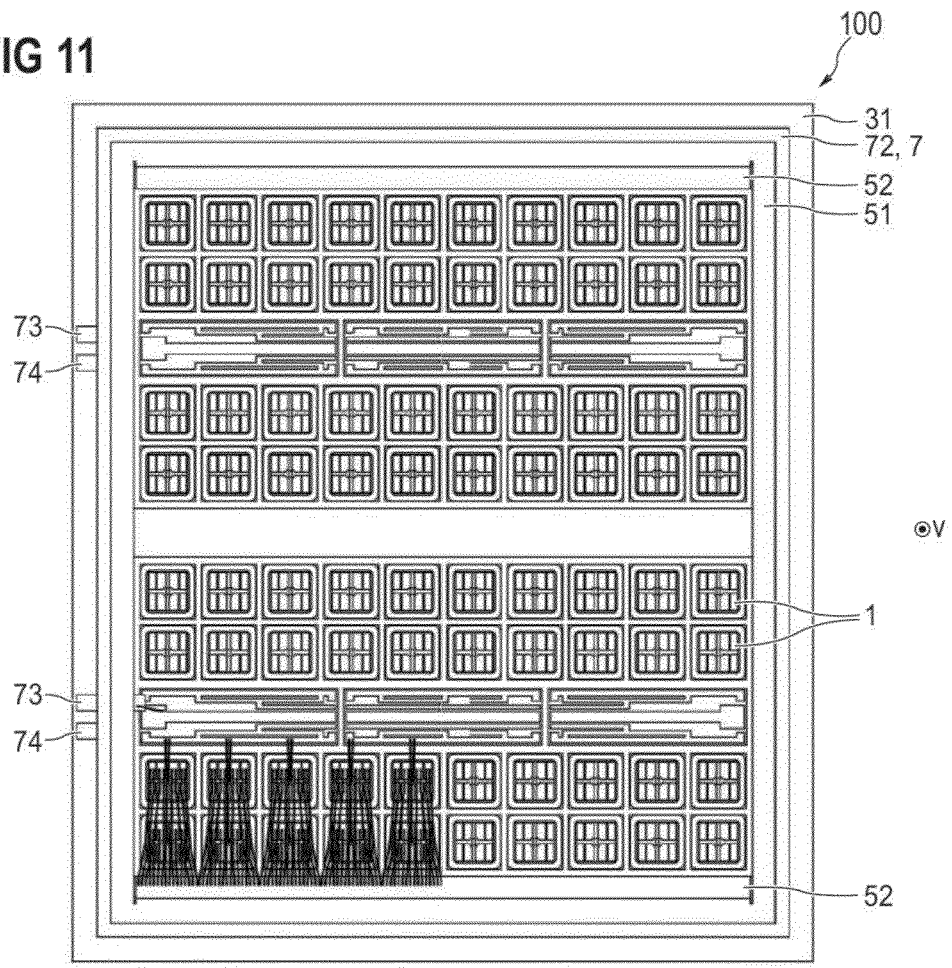
FIG. 11 shows a plan view of a second embodiment of a semiconductor module having a substantially rectangular basic contour, with the upper contact piece removed and with the potting compound removed.

The present invention has been explained above on the basis of the example of semiconductor modules 100 having a circular basic contour. In principle, however, the invention can also be realized with any other basic contours. As an example thereof, FIGS. 10 and 11 show plan views of respective semiconductor modules 100 having a substantially rectangular basic contour, such that the semiconductor chips 1 can particularly easily be arranged in a plurality of rows and/or a plurality of columns. The views correspond to the view in accordance with FIG. 2. In FIGS. 10 and 11 as well, the upper contact pieces 32 and the potting compound 61 are not illustrated.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module, comprising:
   an electrically conductive lower contact piece and an electrically conductive upper contact piece spaced apart from one another in a vertical direction;
   a semiconductor chip having a first load connection and a second load connection, the semiconductor chip being electrically conductively connected by the second load connection to the lower contact piece and electrically conductively connected to the upper contact piece by at least one bonding wire bonded to the first load connection; and
   an explosion protection means arranged between the first load connection and the upper contact piece and into which each of the bonding wires is embedded over at least 80% or over at least 90% of its length.

2. The semiconductor module of claim 1, wherein the explosion protection means has a melting point of at least 1000° C.

3. The semiconductor module of claim 1, wherein the explosion protection means comprises granules or is formed as granules.

4. The semiconductor module of claim 1, further comprising a cover layer composed of a potting compound or a polyimide, the cover layer extending above the semiconductor chip from the first load connection in a direction of the upper contact piece and having a thickness corresponding at most to triple the largest nominal diameter of all the bonding wires bonded to the first load connection.

5. The semiconductor module of claim 4, wherein the cover layer has a penetration of less than 30.

6. The semiconductor module of claim 4, wherein the explosion protection means is spaced apart from the semiconductor chip by at least one of a potting compound and the cover layer.

7. The semiconductor module of claim 1, further comprising an electrically conductive metallic cover layer applied by an electrically conductive connecting layer to a side of the first load connection facing away from the second load connection, the metallic cover layer being cohesively and electrically conductively connected to the first load connection by the connecting layer.

8. The semiconductor module of claim 7, wherein the metallic cover layer comprises molybdenum.

9. The semiconductor module of claim 7, wherein the metallic cover layer has a first metallic sublayer, a second metallic sublayer and a third metallic sublayer which are arranged successively, wherein the second metallic sublayer is arranged between the first metallic sublayer and the third metallic sublayer.

10. The semiconductor module of claim 9, wherein the first metallic sublayer and the third metallic sublayer comprise the same material.

11. The semiconductor module of claim 7, wherein the metallic cover layer has a thickness in a range of 0.2 mm to 2.0 mm.

12. The semiconductor module of claim 7, wherein the metallic cover layer comprises copper.

13. The semiconductor module of claim 12, wherein the metallic cover layer has a thickness in a range of 0.1 mm to 0.5 mm.

14. The semiconductor module of claim 7, wherein the explosion protection means bears directly against a side of the metallic cover layer facing away from the second load connection.

15. The semiconductor module of claim 7, wherein the connecting layer directly adjoins the cover layer and directly adjoins the first load connection, and wherein the connecting layer is embodied as a solder layer or a layer which comprises a sintered metal powder.

16. The semiconductor module of claim 1, wherein the first load connection is a metallization layer comprising aluminum or copper.

17. The semiconductor module of claim 16, wherein the first load connection has a thickness in a range of 7 μm to 100 μm.

18. The semiconductor module of claim 1, further comprising a housing side wall formed as a closed ring, wherein the housing side wall extends in the vertical direction from the lower contact piece as far as the upper contact piece, has a lower projection at a side facing the lower contact piece, the lower projection engaging into a first groove of the lower contact piece, and/or has an upper projection at a side facing the upper contact piece, the upper projection engaging into a second groove of the upper contact piece.

19. The semiconductor module of claim 18, wherein the lower projection, the upper projection, the first groove and the second groove are each formed as a closed ring, wherein the lower projection engages into the first groove over its entire circumference, and wherein the upper projection engages into the second groove over its entire circumference.

20. The semiconductor module of claim 18, wherein the housing side wall has an average thickness of at least 5 mm measured perpendicular to the vertical direction.

21. The semiconductor module of claim 1, further comprising an electrically conductive contact plate having a first shoulder and a second shoulder, wherein each of the bonding wires is bonded to the second shoulder.

22. The semiconductor module of claim 21, wherein the first shoulder directly contacts the upper contact piece.

23. The semiconductor module of claim 21, wherein the first shoulder is formed as a ring and directly contacts the upper contact piece over its entire circumference.

24. The semiconductor module of claim 21, wherein the contact plate has a plurality of subplates separated from one another and electrically conductively connected to one another.

25. The semiconductor module of claim 21, wherein a distance between the second shoulder and the first load connection is less than 25 mm.

26. The semiconductor module of claim 21, further comprising a covering arranged between the explosion protection means and the upper contact piece and which terminates with the contact plate so that no gap permeable to the explosion protection means remains between the covering and the contact plate.

27. The semiconductor module of claim 26, wherein the covering is electrically conductive, electrically conductively connected to the contact plate, is led through a housing side wall between the upper contact piece and the lower contact piece, and is present on the outer side of the semiconductor module as an external connection contact.

28. The semiconductor module of claim 27, wherein the covering is curved convexly in a direction of the lower contact piece so that the covering exerts a contact pressure on the explosion protection means in a direction of the lower contact piece.

29. The semiconductor module of claim 27, further comprising a cavity of at least 10 cm$^3$ between the covering and the upper contact piece.

* * * * *